United States Patent
Mishra et al.

(10) Patent No.: US 10,903,055 B2
(45) Date of Patent: Jan. 26, 2021

(54) EDGE RING FOR BEVEL POLYMER REDUCTION

(71) Applicant: Applied Materials, Inc., Santa Clara, CA (US)

(72) Inventors: Rohit Mishra, Santa Clara, CA (US); Graeme Jamieson Scott, Sunnyvale, CA (US); Khalid Mohiuddin Sirajuddin, San Jose, CA (US); Sheshraj L. Yulshibagwale, Santa Clara, CA (US); Sriskantharajah Thirunavukarasu, Singapore (JP)

(73) Assignee: Applied Materials, Inc., Santa Clara, CA (US)

( * ) Notice: Subject to any disclaimer, the term of this patent is extended or adjusted under 35 U.S.C. 154(b) by 361 days.

(21) Appl. No.: 14/690,121

(22) Filed: Apr. 17, 2015

(65) Prior Publication Data

US 2016/0307742 A1     Oct. 20, 2016

(51) Int. Cl.
*H01J 37/32* (2006.01)
*H01L 21/687* (2006.01)

(52) U.S. Cl.
CPC ...... *H01J 37/32642* (2013.01); *H01J 37/321* (2013.01); *H01J 37/32009* (2013.01);
(Continued)

(58) Field of Classification Search
CPC .......... H01J 37/32642; H01J 37/32477; H01J 37/321; H01J 37/32009; H01J 37/32715;
(Continued)

(56) References Cited

U.S. PATENT DOCUMENTS

| 5,228,052 A | 7/1993 | Kikuchi et al. |
| 5,262,029 A * | 11/1993 | Erskine ............... C23C 16/4585 118/503 |

(Continued)

FOREIGN PATENT DOCUMENTS

| CN | 1847446 A | 10/2006 |
| CN | 1930322 A | 3/2007 |

(Continued)

OTHER PUBLICATIONS

International Seach Report and Written Opinion for PCT/US2016/013390 dated Apr. 25, 2016 (13 pgs.).

(Continued)

*Primary Examiner* — Rakesh K Dhingra
*Assistant Examiner* — Laureen Chan
(74) *Attorney, Agent, or Firm* — Patterson + Sheridan, LLP

(57) ABSTRACT

Embodiments of the present disclosure include methods and apparatuses utilized to reduce residual film layers from a substrate periphery region, such as an edge or bevel of the substrate. Contamination of the substrate bevel, backside and substrate periphery region may be reduced after a plasma process. In one embodiment, an edge ring includes a base circular ring having an inner surface defining a center opening formed thereon and an outer surface defining a perimeter of the base circular ring. The base circular ring includes an upper body and a lower portion connected to the upper body. A step is formed at the inner surface of the base circular ring and above a first upper surface of the upper body. The step defines a pocket above the first upper surface of the upper body. A plurality of raised features formed on the first upper surface of the base circular ring.

9 Claims, 4 Drawing Sheets

(52) U.S. Cl.
CPC .. *H01J 37/32477* (2013.01); *H01J 37/32715* (2013.01); *H01L 21/68735* (2013.01)

(58) Field of Classification Search
CPC ............. H01J 37/32; C23C 16/4585; H01L 21/68721; H01L 21/68735
See application file for complete search history.

(56) References Cited

U.S. PATENT DOCUMENTS

| | | | |
|---|---|---|---|
| 5,476,548 A | 12/1995 | Lei et al. | |
| 5,534,110 A * | 7/1996 | Lenz | C23C 16/4585 118/503 |
| 7,780,786 B2 | 8/2010 | Mitsuhashi et al. | |
| 7,803,246 B2 * | 9/2010 | Huang | H01J 37/32091 156/345.34 |
| 7,862,683 B2 | 1/2011 | Fukiage | |
| 2004/0003780 A1 * | 1/2004 | Yudovsky | C23C 16/4585 118/728 |
| 2004/0203251 A1 | 10/2004 | Kawaguchi et al. | |
| 2005/0078953 A1 * | 4/2005 | Fodor | C23C 16/4585 392/418 |
| 2007/0249182 A1 | 10/2007 | Mani et al. | |
| 2007/0251917 A1 | 11/2007 | Bera et al. | |
| 2007/0283884 A1 * | 12/2007 | Tiller | C23C 14/564 118/715 |
| 2008/0050923 A1 | 2/2008 | Kim et al. | |
| 2008/0141942 A1 * | 6/2008 | Brown | C23C 14/564 118/723 R |
| 2008/0179008 A1 | 7/2008 | Collins et al. | |
| 2008/0194113 A1 * | 8/2008 | Kim | H01J 37/32642 438/710 |
| 2009/0223810 A1 * | 9/2009 | Dhindsa | H01J 37/32091 204/164 |
| 2009/0266299 A1 * | 10/2009 | Rasheed | C23C 16/4581 118/723 R |
| 2010/0078899 A1 * | 4/2010 | Povolny | H01J 37/32642 279/128 |
| 2011/0159211 A1 * | 6/2011 | Du Bois | C23C 16/04 427/569 |
| 2012/0003836 A1 | 1/2012 | Kellogg et al. | |
| 2013/0256128 A1 * | 10/2013 | Ritchie | C23C 14/34 204/298.11 |
| 2014/0034242 A1 * | 2/2014 | Sant | H01J 37/32605 156/345.51 |
| 2014/0154869 A1 | 6/2014 | Geerpuram et al. | |
| 2014/0262026 A1 * | 9/2014 | Forster | B05C 21/005 156/345.3 |

FOREIGN PATENT DOCUMENTS

| | | |
|---|---|---|
| CN | 101677056 A | 3/2010 |
| CN | 1982501 B | 4/2011 |
| CN | 102007572 A | 4/2011 |
| CN | 205984889 U | 2/2017 |
| JP | H02148837 A | 6/1990 |
| JP | H08-081775 A | 3/1996 |
| JP | H09213683 A | 8/1997 |
| JP | 2001509645 A | 7/2001 |
| JP | 2002521815 A | 7/2002 |
| JP | 2003503841 A | 1/2003 |
| JP | 2005-064460 A | 3/2005 |
| TW | M534894 U | 1/2017 |
| WO | 2004027815 A1 | 4/2004 |

OTHER PUBLICATIONS

Office Action from Chinese Patent Application No. 201610236298.5 dated Oct. 31, 2018.
Office Action from Taiwan Patent Application No. 105110920 dated Jun. 26, 2019.
Office Action from Chinese Patent Application No. 201610236298.5 dated Jul. 22, 2019.
Office Action from Chinese Patent Application No. 201610236298.5 dated Mar. 30, 2020.
Office Action from Japanese Patent Application No. 2017-541637 dated Jan. 30, 2020.
Office Action from Chinese Patent Application No. 201610236298.5 dated Jul. 3, 2020.
Notice of Allowane from Japanese Patent Application No. 2017-541637 dated Dec. 8, 2020.

* cited by examiner

EDGE RING FOR BEVEL POLYMER REDUCTION

BACKGROUND

Field

Embodiments of the present disclosure generally relate to a semiconductor processing systems. More specifically, embodiments of the disclosure relates to an edge ring used in a semiconductor processing system utilized to reduce polymers from a bevel or backside of a substrate in semiconductor fabrication.

Description of the Related Art

Integrated circuits have evolved into complex devices that can include millions of components (e.g., transistors, capacitors and resistors) on a single chip. The evolution of chip designs continually requires faster circuitry and greater circuit density. The demands for greater circuit density necessitate a reduction in the dimensions of the integrated circuit components.

As the dimensions of the integrated circuit components are reduced (e.g. to sub-micron dimensions), the importance of reducing presence of contaminant has increased since such contaminant may lead to the formation of defects during the semiconductor fabrication process. For example, in an etching process, by-products, e.g., polymers that may be generated during the etching process, may become a source of particulate, contaminating integrated circuits and structures formed on the substrate.

In order to maintain high manufacturing yield and low costs, the removal of contaminant and/or residual polymer from the substrate becomes increasingly important. Residual polymer present on the substrate bevel may be dislodged and adhered to the front side of the substrate, potentially damaging integrated circuits formed on the front side of the substrate. In the embodiment wherein residual polymer present on the substrate bevel are dislodged and adhered to a backside of a substrate, non-planarity of the substrate during a lithographic exposure process may result in lithographic depth of focus errors.

FIG. 1A depicts a conventional plasma processing chamber 130 for processing a substrate 100 positioned on a pedestal 102 disposed in the processing chamber 130. A shadow ring 124 is disposed on a single ring 128 circumscribing the substrate 100 so as to prevent edges/bevel 106 of the substrate 100 from deposition during a plasma process. However, in some instances, the shadow ring 124 positioned above the single ring 128 is often spaces a distance above the surface of the edges/bevel 106, forming a gap 134 between the shadow ring 125 and the single ring 126, so as to prevent the shadow ring 124 from being in direct contact with the substrate 100. The gap 134 formed between the shadow ring 125 and the single ring 126 may allow the plasma 120 generated during the processing to travel into the gap 134, as shown by the arrow 138, forming undesired film layer on front surface 110, backside 122 and the edges/bevel 106 of the substrate 100, as well as attacking the chamber parts, such as the pedestal 102 and the single ring 126. In one cases, the backside 112 of the substrate 102 may have higher amount of contamination than the front side 110 of the substrate 102. Furthermore, erosion and gradual degradation of the chamber components due to plasma exposure may result in gaps 134 becomes wider, resulting in degrading voids and surface defects both on the substrate bevel/edges 106 and the chamber parts.

FIG. 1B depicts a conventional example of the substrate 100 after undesired film layer 110 has accumulated on the edges/bevel 106 of the substrate 100. As the plasma travels through the gap 134, undesired film layers may be formed on the bevel 106 at periphery regions 108 of the substrate, from front side 102 even extending to a backside 104 of the substrate 100. Residual polymer or undesired film layers present on the bevel 106 and/or the backside 104 of the substrate 100 may also be dislodged and flaked off during robot transfer process, substrate transport process, subsequent manufacturing processes, and so on, thereby resulting in contamination in transfer chambers, substrate cassettes, process chambers and other processing equipment that may be subsequently utilized in the circuit component manufacturing process. Furthermore, flakes of the polymer or residual film layers may become a source of particulate contamination during substrate processing. Contamination of processing equipment results in increased tool down time, thereby adversely increasing the overall manufacturing cost.

Therefore, there is a need for an apparatus and method to improve deposition efficiency with minimum residual deposition from substrate bevel to substrate backside while maintaining integrity of structures formed on substrate front side.

SUMMARY

Embodiments of the present disclosure include methods and apparatuses that may be utilized to reduce residual film layers from a substrate periphery region, such as an edge or bevel of the substrate. Contamination of the substrate bevel, backside and substrate periphery region may be reduced after a plasma process. In one embodiment, an edge ring includes a base circular ring having an inner surface defining a center opening formed thereon and an outer surface defining a perimeter of the base circular ring. The base circular ring includes an upper body and a lower portion connected to the upper body. A step is formed at the inner surface of the base circular ring and above a first upper surface of the upper body. The step defines a pocket above the first upper surface of the upper body. A plurality of raised features formed on the first upper surface of the base circular ring.

In another embodiment, a plasma processing chamber includes an edge ring circumscribing the substrate support assembly, a shadow ring disposed above the edge ring, and a cavity formed between the edge ring and the shadow ring, wherein a plurality of raised features formed on a upper surface of the edge ring lifts up the shadow ring from the edge ring to form the cavity therebetween.

In yet another embodiment, a method for reducing substrate bevel contamination includes forming a cavity between a shadow ring and an edge ring circumscribing a periphery region of a substrate support assembly disposed in a plasma processing chamber, wherein the cavity is formed by a plurality of raised features formed on a upper surface of the edge ring lifting up the shadow ring from the edge ring to form the cavity therebetween, wherein the cavity allows an open fluid communication from a plasma region defined above the substrate support assembly to a pump disposed in the plasma processing chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings.

Figure 1A:
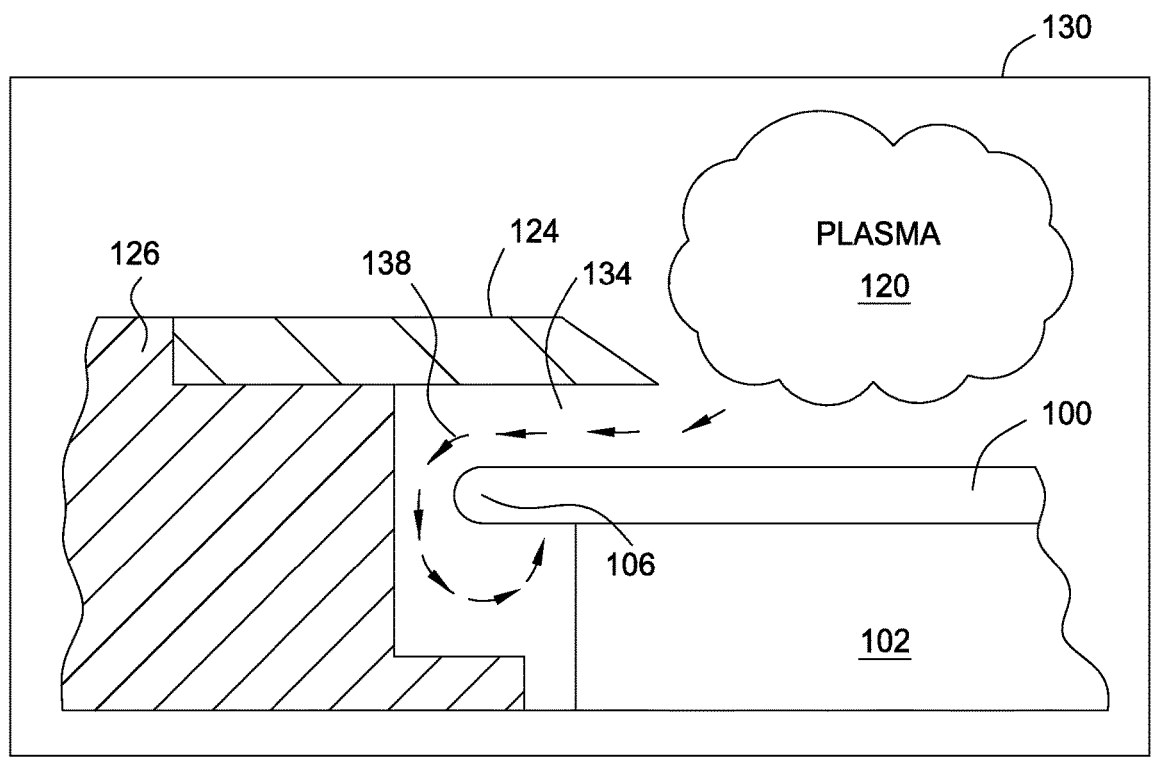
FIG. 1A-1B illustrate a portion of a conventional plasma processing chamber with residual contamination formed on a bevel of a substrate.

It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures.

DETAILED DESCRIPTION

Embodiments of the present disclosure include methods and apparatuses that may be utilized to reduce residual film layers from a substrate periphery region, such as an edge or bevel of the substrate. Contamination of the substrate bevel, backside and substrate periphery region may be reduced after a plasma process. In the embodiment, the apparatus may include an edge ring that may define a cavity among a substrate bevel, the edge ring and a shadow ring positioned above the edge ring. The cavity is in open communication with a pump of the apparatus so that plasma travelling into the cavity across the substrate bevel may be efficiently pumped out of the apparatus, rather than remaining near the substrate level, forming undesired residual film layers on the substrate bevel or on a backside of the substrate.

Figure 2:
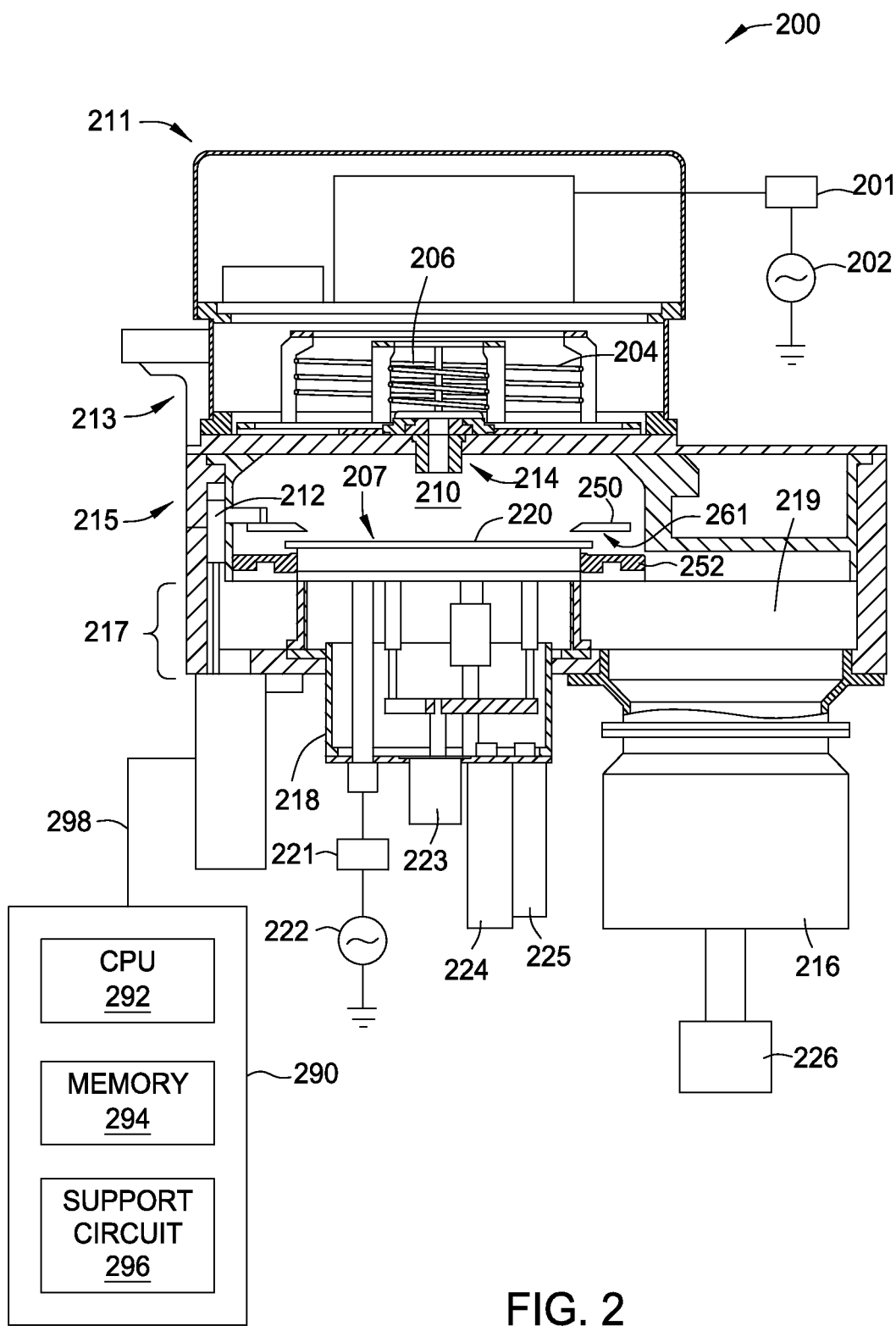
FIG. 2 illustrates a schematic isometric view of an apparatus with an edge ring that may minimize bevel residual contamination.

FIG. 2 depicts a schematic isometric view of a processing chamber 200 that may be used in conjunction with embodiments of the present disclosure to reduce the likelihood of residual film layers forming on substrate bevel. The processing chamber 200 may be a DPS II TSV processing chamber available from Applied Materials, Inc., Santa Clara, Calif., or other suitable vacuum chambers. The processing chamber 200 may be a fully automated semiconductor plasma processing chamber of the kind which is typically employed as part of a multi-chamber, modular system (not shown). The processing chamber 200 including a chamber body 215 having a processing volume 210 that may be configured to accommodate a substrate 220 having a diameter size up to 12 inch (300 mm), 18 inch (450 mm), or other diameter.

The processing chamber 200 includes a plasma power source 202 and a matching network 201 which are in communication with a power generating apparatus present within a first enclosure 211 disposed on the chamber body 215. The plasma source power 202 and matching network 201 operate at a frequency which is typically in the range of about 12 MHz to about 13.5 MHz (while this particular processing chamber operates at this frequency, other processing chambers which may be used operate at source power frequencies ranging up to 60 MHz), at a power in the range from 0.1 kW to about 5 kW. Inductive coils 204, 206 are located within a second enclosure 213 disposed between the chamber body 215 and the first enclosure 211. The inductive coils 204, 206 may generate an RF inductively coupled plasma in the processing volume to perform a plasma process on the substrate 220 disposed on a substrate support assembly 207 disposed in the chamber body 215. A processing source gas may be introduced into the processing volume 210 through a gas exchange nozzle 214 to provide uniform controlled gas flow distribution.

The processing volume 210 present within the chamber body 215 is in communication with a lower processing chamber 217. The lower processing chamber 217 is in communication with a throttle valve 219 located above and in communication with a turbo pump 216, which is located above and in communication with a roughing pump 226. In operation, plasma source gas is provided to processing volume 210 and processing by-products are pumped out of the processing volume 210 through the throttle valve 219, turbo pump 216 and roughing pump 226. A substrate entry port 212 is formed in the chamber body 215 to facilitate entry and removal of the substrate 220 from the processing chamber 200.

The substrate support assembly 207 is disposed within the chamber body 215 to support the substrate 220 during processing. The substrate support assembly 207 may be a conventional mechanical or electrostatic chuck with at least a portion of the substrate support assembly 207 being electrically conductive and capable of serving as a process bias cathode. A cooling fluid supplying inlet 224 may be coupled to the substrate support assembly 207 configured to supplying cooling fluid to the substrate support assembly 207 to maintain the temperature thereof at a desired range. Substrates disposed on the substrate support assembly 207 may be raised and lowered by means of a wafer lift pins (not shown) to facilitate transfer of the substrate onto and off of the substrate support assembly 207.

A shadow ring 250 is disposed on an edge ring 252 circumscribing a periphery region of the substrate support assembly 207. The edge ring 252 is shaped in a manner to define a cavity 261 above the edge ring 252 when positioned under the shadow ring 250. The cavity 261 as defined may efficiently allows plasma to flow in a direction away substrate bevel and be pumped out of the processing chamber through the cavity 261 defined between the rings 250, 252 through the throttle valve 219 to the turbo pump 216 and roughing pump 226, rather than accumulating and forming a residual film layer on the substrate bevel or backside. Details regarding the configurations and placement of the edge ring 252 will be further described below with reference to FIGS. 3-4C.

The controller 290 includes a central processing unit (CPU) 292, a memory 294, and a support circuit 296 utilized to control the process sequence and regulate the gas flows and plasma process performed in the processing chamber 200. The CPU 292 may be of any form of a general purpose computer processor that may be used in an industrial setting. The software routines such as the etching process described below can be stored in the memory 194, such as random access memory, read only memory, floppy, or hard disk drive, or other form of digital storage. The support circuit 296 is conventionally coupled to the CPU 292 and may include cache, clock circuits, input/output systems, power supplies, and the like. Bi-directional communications between the controller 290 and the various components of the processing chamber 200 are handled through numerous signal cables collectively referred to as signal buses 298, some of which are illustrated in FIG. 2.

In one embodiment, the substrate 220 provided in the processing chamber 200 is biased by providing RF power from a RF bias power source 222 through a matching network 221 coupled to the substrate support assembly 207. RF power provided by the RF bias power source 222 may be within the range of 100 kHz to 13.56 MHz, such as within the range of 100 kHz to 2 MHz. The plasma power source 202 and the substrate RF bias power source 222 are independently controlled by the controller 290. In particular, the RF bias power source 222 is pulsed using a generator pulsing capability set by system controllers to provide a percentage of time that the power is on which is referred to as the "duty cycle." The time on and time off of a pulsed bias power is uniform throughout substrate processing. In this instance, for example, if the power is on for 3 msec and off for 15 msec, the "duty cycle" would be 16.67%. The pulsing frequency in cycles per second (Hz) is equal to 1.0 divided by sum of the on and off time periods in seconds. For example, when the power is on for 3 msec and off for 15 msec, for a total of 18 msec, the pulsing frequency in cycles per second is 55.55 Hz. It would be possible to use a specialized pulsing profile where on/off timing changing during substrate processing for particular needs.

Figure 1B:
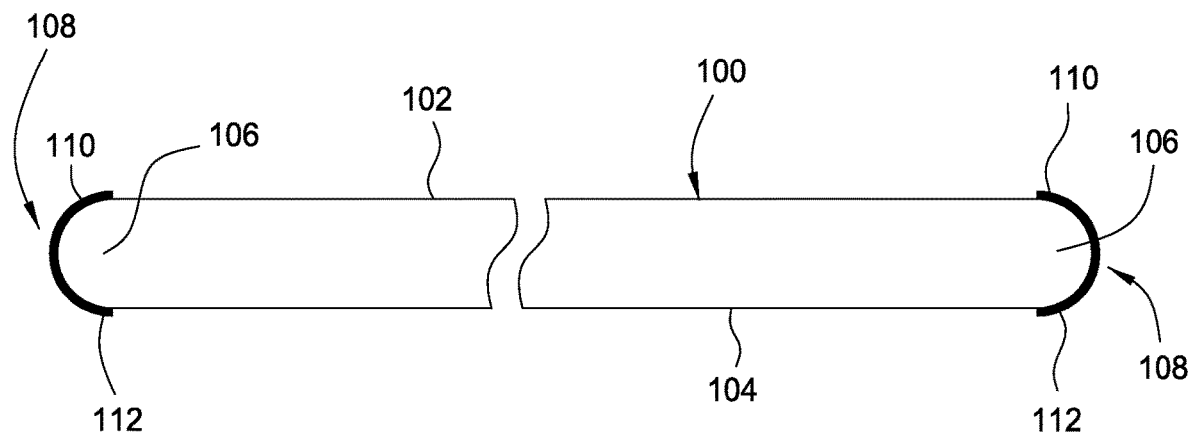
Figure 3:
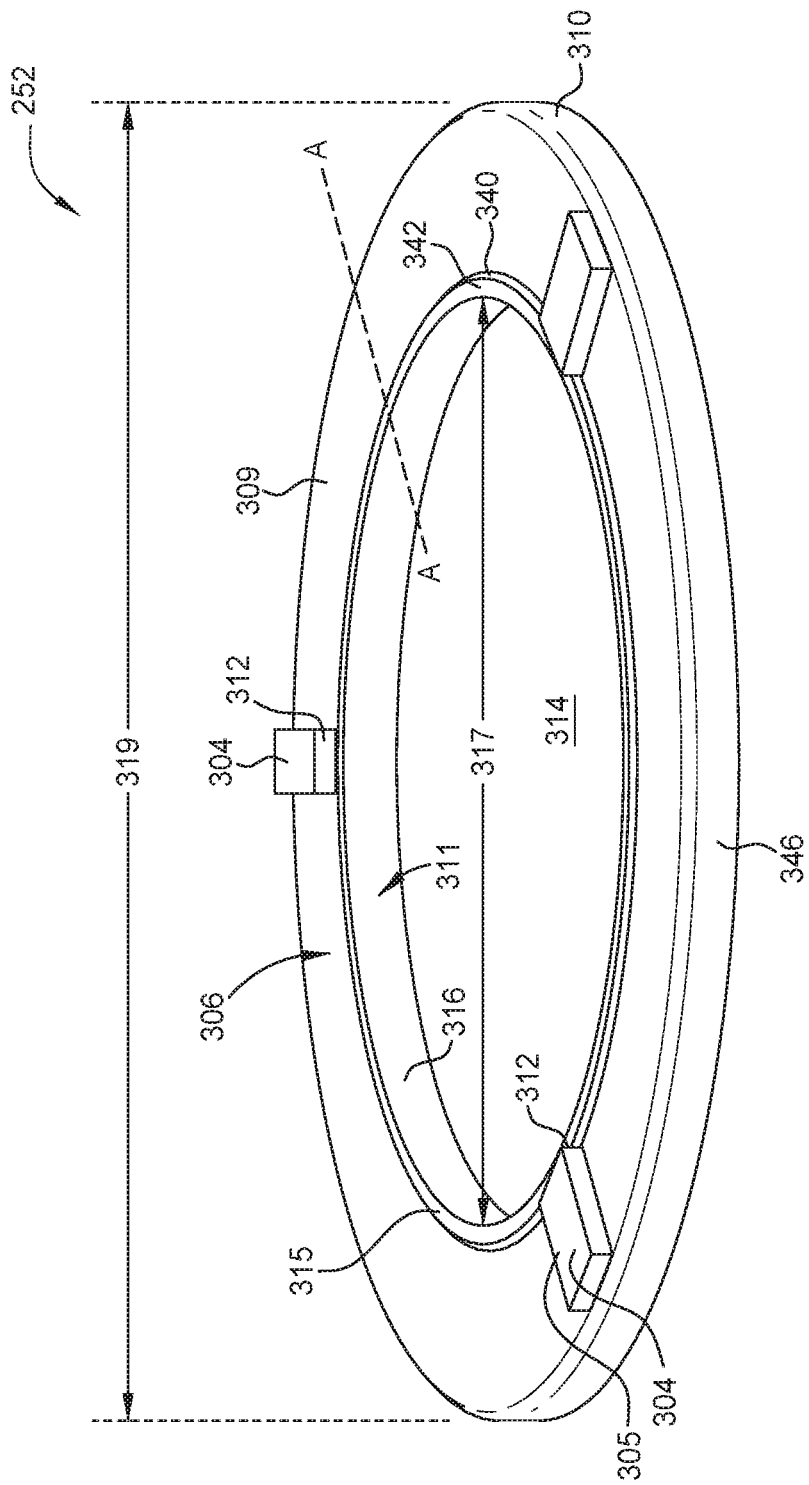
FIG. 3 illustrates a schematic isometric view of an edge ring used in the apparatus of FIG. 2.

FIG. 3 depicts a top view of one embodiment of the edge ring 252 depicted in FIG. 1. The edge ring 252 includes a base circular ring 306 with an upper surface 309 and raised features 304 disposed on the upper surface 309. A central opening or bore 314 is formed in a center portion of the edge ring 252 to receive a substrate disposed therein when the edge ring 252 is implemented in a processing chamber, such as the processing chamber 200 depicted in FIG. 2. The base circular ring 306 has an inner surface 316 that defines an inner diameter 317 of the base circular ring 306 as well as defining the outer circumference of the central opening or bore 314. The base circular ring 306 also includes an outer surface 310 that defines an outer diameter 319 (e.g., perimeter) of the base circular ring 306. A bottom portion 311 is attached to a bottom surface (not shown) of the edge ring 252.

A step 315 is formed in and shared a sidewall with the inner surface 316 of the base circular ring 306. The step 315 having a predetermined width extending in a direction outward toward the outer surface 310. The step 315 may defines a step-height slightly above the upper surface 309 of the base circular ring 306. Details regarding the configurations of the step 315 and the base circular ring 306 will be further described below with referenced to FIGS. 4A-4C.

In one example, a plurality of raised features 304 is formed on the upper surface 309 of the base circular ring 306. The raised features 304 may include a linear raised surface 305 (e.g., a top surface) extending along the width of the upper surface 309 of the base circular ring 306 extending from the inner surface 316 to the outer surface 310. The linear raised surface 305 is substantially a planar surface facing in parallel with a bottom surface of the shadow ring 250. The raised feature 304 has a first end 312 facing toward the central opening or bore 314 so that when a substrate is positioned within the central opening or bore 314, the first end 312 may serve as a guide member to guide or align the substrate into a desired position. Furthermore, the raised features 304 formed on the upper surface 309 of the base circular ring 306 may also engage with and lift the shadow ring 250 by its raised surface 305 (e.g., a top surface) and prevent the shadow ring 250 from being in direct contact with upper surface 309 of the base circular ring 306. By doing so, the cavity 261 may be efficiently created between the shadow ring 250 and the edge ring 252 to allow flow radially outwards between the rings 252, 250 away from the substrate bevel. In the example depicted in FIG. 3, three raised features 304 are present. It is noted that the numbers, shapes, dimensions and configurations of the raised features 304 spacing the shadow ring 250 from the base circular ring 306 may be in any form or by any numbers as needed for different process and equipment requirements.

Figure 4A:
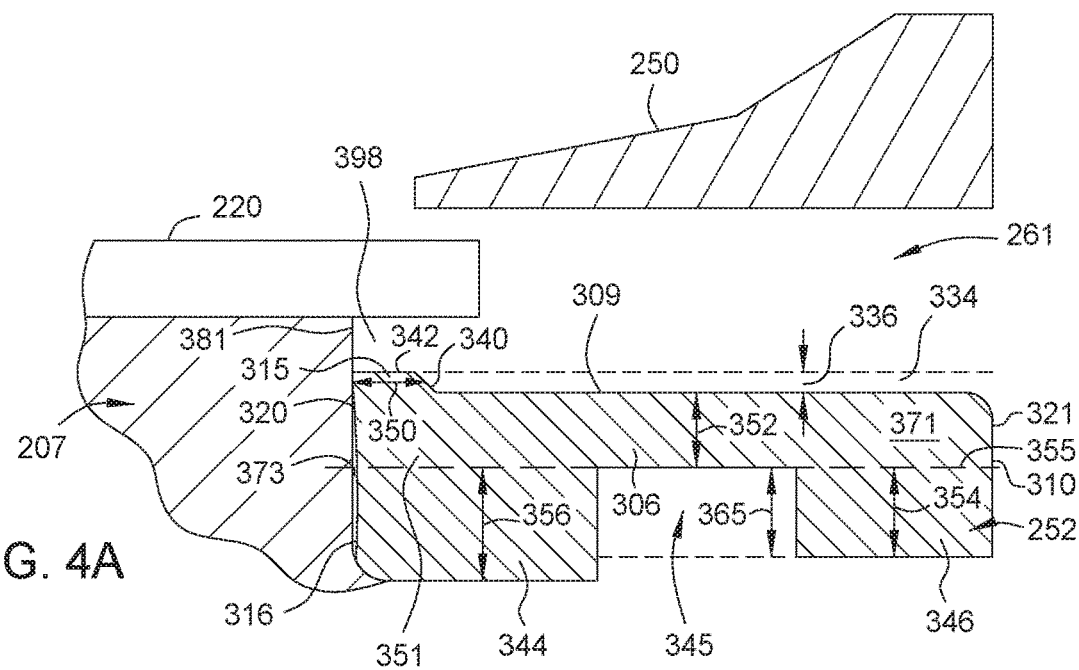
FIG. 4A-4C illustrates different examples of edge rings that may be utilized in the apparatus of FIG. 2.

FIG. 4A depicts a cross sectional view of the edge ring 252 along a cut-away line A-A' depicted in FIG. 3. The shadow ring 250 is spaced above the edge ring 252 by the raised features 304 (which are not shown in FIG. 4A). It is noted that the shadow ring 250 is only shown in FIG. 4A and is removed from FIGS. 4B and 4C for ease and brevity of description and illustration. The edge ring 252 includes the base circular ring 306 having an upper body 371 connected to the lower portion 311 (shown and divided by the dotted line 355), together forming an unitary body. The base circular ring 306 includes the inner surface 316 positioned proximate to a sidewall of the substrate support assembly 207. In one example depicted in FIG. 4A, the inner surface 316 is positioned proximate to a sidewall 381 of the substrate support assembly 207 but not in contact with the substrate support assembly 207, leaving a gap 373 therebetween.

The step 315 is formed at a first end 351 of the upper body 371 and above the upper surface 309 of the base circular ring 306. The step 315 has an upper surface 342 defining a step-height 336 from the upper surface 309 of the base circular ring 306, creating a sloped surface 340 connecting between the upper surface 342 of the step 315 and the upper surface 309 of the base circular ring 306. The step-height 336 formed between the upper surface 342 of the step 315 and the upper surface 309 of the base circular ring 306 allows a pocket 334 to be formed above the upper surface 309 of the base circular ring 306. The pocket 334 is in open fluid communication between the processing volume 210 and the pump 226 through throttle valve 219. The pocket 334 may then later form and serve as the cavity 261, when implemented in the processing chamber 200, that allows the plasma travelled from the processing volume 210 to bypass the substrate bevel and flow in a direction away from the substrate bevel to the cavity 261 and readily pumped out of the processing chamber 200, rather than accumulating on the substrate bevel and undesirably forming a residual film layer thereon. In one example, the step-height 336 is between about 1 mm and about 5 mm defined between the upper surface 309 of the base circular ring 306 and the upper surface 342 of the step 315.

The step 315 formed in the base circular ring 306 may substantially engage with and cover a portion of the sidewall 381 of the substrate support assembly 207, leaving a space 398 above the upper surface 342 of the step 315. The space 398 defined above the upper surface 342 of the step 315 may provide an open fluid communication region that allows the plasma followed thereto to bypass the substrate bevel and flow in a direction away from the substrate bevel, forming a open channel to allow the plasma being pumped out of the processing chamber, rather than accumulating on the substrate backside or bevel. In one example, the step 315 may have a width 350 about 0.5 mm and about 5 mm. Although the example depicted in FIG. 4A includes the space 398 defined above the step 315, it is noted that the space 398 left thereabove may be in any size, configuration or in any dimension, including no space left above, which is similar to the example depicted in FIG. 4B and will be described later below.

A recess 342 is formed in the lower portion 311 of the base circular ring 306, dividing the lower portion 311 into a first lower part 344 and a second lower part 346. The first lower part 344 defines a lower part of the inner surface 316 while the second lower port 346 defines a lower part of the outer surface 310. The upper body 371, in contrast, has two ends 321, 319 defining an upper part of the inner surface 316 and an upper part of the outer surface 310. The recess 342 may be configured to mate with other chamber parts when positioned in the processing chamber 200 so as to secure the position of the edge ring 252. The recess 342 may have a depth 365 between about 2 mm and about 10 mm. The first lower part 344 generally has a first depth 356 longer than a second depth 354 of the second lower part 346. In one example, the first depth 356 of the first lower part 344 is between about 10% and about 50% longer than the second depth 354 of the second lower part 346. In one example, the first depth 356 is between about 3 mm and about 10 mm and the second depth 354 is between about 2 mm and about 10 mm. The upper body 371 connected to the lower portion 311 has a uniform thickness 352 between about 1 mm and about 15 mm.

In one example, the edge ring 252 may be fabricated from any suitable material that has high resistance to corrosive plasma species. Suitable materials for fabricating the edge ring 252 include dielectric materials, ceramic materials, metal containing dielectric material. In one example, the edge ring 252 may be aluminum oxide ($Al_2O_3$), aluminum nitride (AlN), $Y_2O_3$, Si, silicon carbide, anodized $Al_2O_3$, quartz, and yttrium containing materials.

Figure 4B:
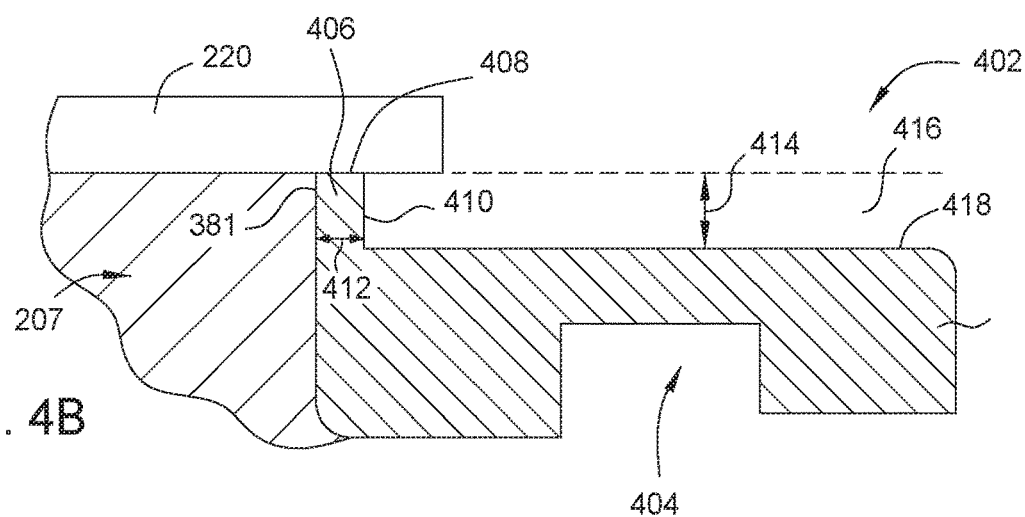

FIG. 4B depicts another embodiment of an edge ring 402 with a different configuration of a step 406 having a width 412 formed above an upper surface 418 of edge ring 402. Similarly, the edge ring 402 is in form of a base circular ring 407 similar to the edge ring 252 described above including the raised features 304 (not shown in FIG. 4B) which space the shadow ring 250 above the edge ring 402 and a recess 404. The step 406 has an upper surface 408 defining a step-height 414 from the upper surface 418 of the base circular ring 407, creating a pocket 416 above the upper surface 418 of the base circular ring 407. However, contrary to the sloped surface 340 formed in FIG. 4A, a substantially vertical sidewall 410 is formed to define the step 408 with a substantially straight sidewall profile. The vertical sidewall 410 may have substantially the same height as the step-height 414 defined between the upper surface 408 of the step 108 and the upper surface 48 of the base circular ring 407.

The step 406 as formed in the base circular ring 407 may substantially engage with and cover most of the sidewall 381 of the substrate support assembly 207, leaving minimum or little space above the upper surface 408 of the step 406. As a result, most portion of the sidewall of the substrate support assembly 207 is efficiently covered by edge ring 402, including the projected step 406, efficiently blocking the plasma from in contact with the substrate support assembly 207 and minimizing the likelihood of the support assembly 207 from plasma attack. Other structures and portions of the edge ring 402 are similarly constructed as the edge ring 252 depicted in FIG. 4A.

Figure 4C:
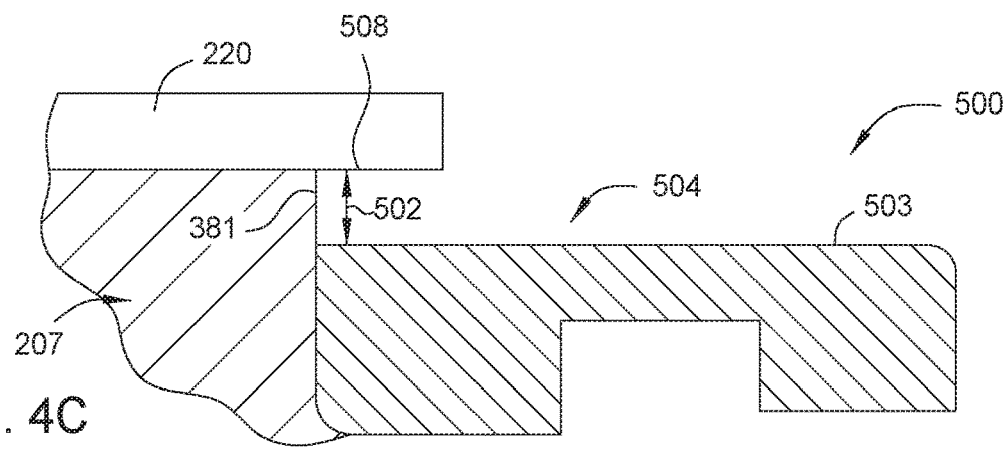

FIG. 4C depicts yet another example of an edge ring 500, similar to the edge rings 252, 402 described above in FIGS. 4A-4B. The edge ring 500, when positioning in the processing chamber 200, also defines a cavity 504 below the shadow ring 250 (shown in FIG. 4A). However, unlike the configurations depicted in FIGS. 4A-4B, the edge ring 500 has a substantially planar surface 503 without steps or protrusions formed thereabove, except for the raised features 304 (as shown in FIG. 3) which space the shadow ring 250 above the edge ring 500. The edge ring 500 is configured to have a spaced part relationship to the substrate 220, particularly the substrate bevel, so that the cavity 504 defined above the surface 503 of the edge ring 500 may maintain an open fluid communication that allows the plasma followed thereto to bypass substrate bevel and backside 508 and be pumped out of the processing chamber 200 between the rings 250, 500 through the throttle valve 219 and the pumps 226 disposed in the processing chamber 200. In one example, the edge ring 500 may define a distance 502 between about 1 mm and about 5 mm from the backside 508 of the substrate 220 when positioning in a plasma processing chamber, such as the processing plasma chamber 200 depicted in FIG. 2.

Thus, the present disclosure provides an edge ring that may efficiently reduce residual film layers formed on bevel or a backside of a substrate after a plasma process. The edge ring may include a pocket, which may form a cavity when implementing in a plasma processing chamber that remains an open fluid communication for plasma travel therethrough to be efficiently pumped out of the plasma processing chamber. The pocket formed in the edge ring may be defined by a step form on an upper surface of the edge ring. By utilizing the cavity formed above the edge ring, the residual plasma may be efficiently pumped out of the processing chamber, rather than accumulating at the substrate bevel and backside, so that the likelihood for the residual film layer or contamination to be formed on the substrate bevel and backside is significantly reduced and eliminated.

While the foregoing is directed to embodiments of the present disclosure, other and further embodiments of the disclosure may be devised without departing from the basic scope thereof, and the scope thereof is determined by the claims that follow.

What is claimed is:
1. An edge ring configured for use in a plasma processing chamber and configured to circumscribe a periphery region of a substrate support assembly, comprising:
   a base circular ring formed of unitary body having an inner surface defining a center opening formed thereon and an outer surface defining a perimeter of the base circular ring, the base circular ring including an upper body having a first upper surface and a lower portion connected to the upper body;
   a recess formed in the lower portion of the base circular ring;
   a first lower part and a second lower part formed in the lower portion of the base circular ring divided by the recess, wherein the first lower part and the second lower part have mismatched depths;
   a step formed along a portion of the inner surface of the base circular ring, the step having a second upper surface formed parallel to the first upper surface of the base circular ring and extending to the inner surface of the base circular ring, the step further includes a sloped surface defining a sidewall of the step, a first end of the sloped surface connected to the first upper surface of the base circular ring and a second end of the sloped surface connected to the second upper surface, the second upper surface and an associated sidewall of the substrate support assembly configured to define a pocket above the first upper surface of the base circular ring, wherein the sloped surface rises above the first upper surface; and
   a plurality of raised features formed on and extending upward from the first upper surface of the base circular ring, wherein each raised feature of the plurality of the raised features has a top surface which is substantially planar and extends from the outer surface of the base circular ring to the first end of the sloped surface of the step, and the top surface of each raised feature is configured to engage with and lift an overlying shadow ring to prevent the shadow ring from being in direct contact with the first upper surface of the base circular ring.

2. The edge ring of claim 1, wherein the raised features have a length in a radial direction that substantially matches to a width of the first upper surface of the base circular ring.

3. The edge ring of claim 1, wherein the base circular ring is fabricated from $Al_2O_3$, AlN, $Y_2O_3$, Si, or SiC, quartz, yttrium containing materials and anodized $Al_2O_3$.

4. The edge ring of claim 1, wherein the step formed along a portion of the inner surface of the base circular ring is configured to substantially cover most part of the sidewall of the substrate support assembly.

5. The edge ring of claim 1, wherein the step formed along a portion of the inner surface of the base circular ring is configured to substantially cover a first portion of the sidewall of the substrate support assembly while leaving a space above the step exposing a second portion of the sidewall of the substrate support assembly.

6. The edge ring of claim 1, wherein the first lower part has a first depth between about 10 percent and about 50 percent longer than a second depth of the second lower part.

7. The edge ring of claim 1, wherein the step has a height of between about 1 mm and about 5 mm defined between the first upper surface of the base circular ring and the second upper surface of the step.

8. The edge ring of claim 1, wherein the top surface of the raised features is a planar surface configured to be in parallel with a bottom of the shadow ring.

9. The edge ring of claim 1, wherein the inner surface of the base circular ring is configured to be positioned proximate to the sidewall of the substrate support assembly but not in contact with the sidewall of the substrate support assembly, leaving a gap therebetween.

* * * * *